US011315609B2

United States Patent
Bhaskaran et al.

(10) Patent No.: US 11,315,609 B2
(45) Date of Patent: Apr. 26, 2022

(54) MEMORY WITH HIGH-SPEED AND AREA-EFFICIENT READ PATH

(71) Applicant: QUALCOMM Incorporated, San Diego, CA (US)

(72) Inventors: Adithya Bhaskaran, Austin, TX (US); Mukund Narasimhan, Bangalore (IN); Shiba Narayan Mohanty, Bhubaneswar (IN)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 17/039,742

(22) Filed: Sep. 30, 2020

(65) Prior Publication Data

US 2021/0020206 A1 Jan. 21, 2021

Related U.S. Application Data

(62) Division of application No. 16/421,365, filed on May 23, 2019, now Pat. No. 10,854,246.

(51) Int. Cl.
*G11C 7/00* (2006.01)
*G11C 7/06* (2006.01)
*G11C 7/10* (2006.01)
*H03K 19/20* (2006.01)

(52) U.S. Cl.
CPC ............ *G11C 7/06* (2013.01); *G11C 7/106* (2013.01); *G11C 7/1069* (2013.01); *H03K 19/20* (2013.01)

(58) Field of Classification Search
CPC ....... G11C 5/147; G11C 5/14; G11C 11/4074; G11C 16/30; G11C 5/143

USPC ............................................. 365/226, 189.05
See application file for complete search history.

(56) References Cited

U.S. PATENT DOCUMENTS

| 5,986,956 | A | 11/1999 | You |
| 6,310,805 | B1 | 10/2001 | Kasa et al. |
| 6,714,467 | B2 | 3/2004 | Terzioglu et al. |
| 6,768,698 | B2* | 7/2004 | Kono ............... G11C 7/1066 365/189.05 |
| 9,124,276 | B2* | 9/2015 | Lin ................. G11C 7/1057 |
| 10,147,492 | B1 | 12/2018 | Wang |
| 10,854,246 | B1 | 12/2020 | Bhaskaran et al. |
| 2004/0032769 | A1 | 2/2004 | Takahashi et al. |
| 2005/0248998 | A1 | 11/2005 | Jung |
| 2005/0286324 | A1 | 12/2005 | Arakawa |
| 2008/0298144 | A1 | 12/2008 | Yumoto |
| 2014/0176221 | A1 | 6/2014 | Lin et al. |
| 2014/0185367 | A1 | 7/2014 | Ngo et al. |
| 2018/0033495 | A1* | 2/2018 | Ghosh ............. G11C 29/781 |

FOREIGN PATENT DOCUMENTS

| EP | 1717814 A1 | 11/2006 |
| KR | 20030095874 A | 12/2003 |
| KR | 20100036596 A | 4/2010 |

OTHER PUBLICATIONS

International Search Report and Written Opinion—PCT/US2020/034378—ISA/EPO—dated Nov. 6, 2020.

* cited by examiner

*Primary Examiner* — Son T Dinh
(74) *Attorney, Agent, or Firm* — Qualcomm Incorporated

(57) ABSTRACT

A read path for a memory is provided that includes an integrated sense mixing and redundancy shift stage coupled between a sense amplifier and a data latch. The data latch is integrated with a level shifter.

3 Claims, 5 Drawing Sheets

MEMORY WITH HIGH-SPEED AND AREA-EFFICIENT READ PATH

CROSS REFERENCE TO RELATED APPLICATIONS

The present application is a divisional application of U.S. Non-Provisional patent application Ser. No. 16/421,365, filed May 23, 2019, which is hereby incorporated by reference in its entirety.

TECHNICAL FIELD

This application relates to memories, and more particularly to an improved memory read path.

BACKGROUND

In a conventional memory such as a static random-access memory (SRAM), a sense amplifier makes a bit decision for an accessed bitcell during a read operation. But the output of the sense amplifier is only valid during a sense enable period, so the sense amplifier typically drives a sense mixing stage that passes the bit decision from the sense amplifier only while a sense enable signal is asserted. To implement column redundancy in case of errors, a redundancy shift stage can selectively shift the output of the sense mixing stage to a redundant column. Should there be no redundancy shift, the redundancy shift stage drives a data latch for latching the bit decision.

It is also conventional for a memory to have an independent power supply voltage from the power supply voltage for the core logic that will receive the bit decision during the read operation. The memory read path thus typically includes a level shifter to level shift the latched bit decision from the data latch from the memory power domain into the core logic power domain. A data output driver then drives the level-shifted bit decision to the core logic.

The various stages in the memory read path delay the read operation speed and occupy die space. There is thus a need in the art for memories with an improved data read path that reduces power consumption and increases area efficiency.

SUMMARY

A memory read path is provided that includes an integrated sense mixing and redundancy shift stage having a first transistor. A logic circuit such as a logic gate processes a sense enable signal and also a redundancy shift signal to produce a combined sense enable and shift redundancy signal that is asserted only when the sense enable signal is asserted when no redundancy shift is performed. The combined sense enable and shift redundancy signal controls a switching of the first transistor so that the first transistor conducts when the sense enable signal is asserted in the absence of redundancy shifting.

The first transistor couples between a sense amplifier and a data latch for the read path. During a read operation, the sense amplifier senses a bit from a bitcell to make a bit decision while the sense enable signal is asserted. Should there be no redundancy shift, the sense amplifier can then drive a bit decision though the switched-on first transistor so that the bit decision can be latched in the data latch.

The mixing of the redundancy shift signal and the sense enable signal by the logic gate to produce the combined sense enable signal and redundancy shift signal is quite advantageous as the resulting control of the first transistor produces relatively little delay in the conduction of the bit decision from the sense amplifier to the data latch. The first transistor is also relatively compact.

To further increase the speed and area savings for the read path, the data latch is integrated with a level shifter to shift the latched bit decision from a memory domain power supply voltage to an output domain power supply voltage (for example, a core logic domain power supply voltage). The resulting memory data path is thus advantageously fast and compact.

These and additional advantages may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
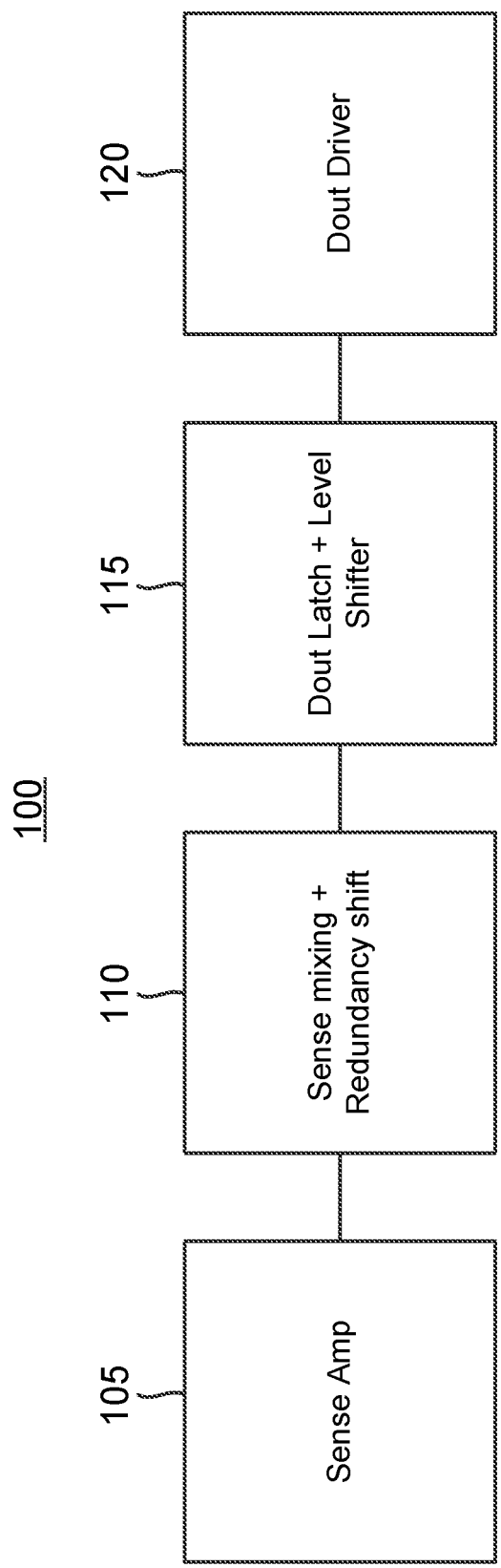
FIG. 1 illustrates a memory read path in accordance with an aspect of the disclosure.

Turning now to the drawings, an improved memory read path 100 is shown in FIG. 1. A sense amplifier 105 senses an accessed bitcell (not illustrated) during a read operation to output a bit decision signal. To increase operating speed and density, an integrated sense mixing and redundancy shift stage 110 processes the bit decision signal from sense amplifier 105. As will be explained further herein with reference to FIG. 2A, sense mixing and redundancy shift stage 110 includes a first transistor such an n-type metal-oxide semiconductor (NMOS) first transistor M2 that is switched on in response to a combined sense enable and redundancy shift signal (Red_sel_on). The combined sense enable and redundancy shift signal is only asserted when both a sense enable signal (Sense_enable) and a redundancy shift-on signal (Red_on) are true. In that case, first transistor M2 conducts to pass the bit decision (Int_q) from sense amplifier 105 to an input node for a redundant column. A second transistor such as an NMOS second transistor M3 responds to a combined sense enable and redundancy shift-off signal (Red_sel_off) that is asserted only when both the sense enable signal and a redundancy-off signal (Red_off) are both true. In that case, second transistor M3 conducts to pass the bit decision signal to a combined data output latch and level shifter stage 115.

Sense amplifier 105 has a relatively strong drive compared to a conventional logic gate. The operation of the first transistor and the second transistor in sense enable and redundancy shift stage 110 is thus quite advantageous in that the sense amplifier 105 can readily drive the bit decision through the selected first or second transistor. In contrast, the sense amplifier in a conventional read data path would drive its bit decision into logic gates within a separate sense enable mixing stage. The drive of the sense amplifier is thus lost as it is the logic gates that must drive the mixed bit decision to a separate redundancy shift stage that in turn would implement the redundancy shift using logic gates. The resulting multiple stages of logic gates not only lose the drive of the sense amplifier but also introduce delay. In contrast, the pass transistors in sense enable and redundancy shift stage 110 introduce less delay and occupy less die space.

Referring again to FIG. 1, sense mixing and redundancy shift stage 110 drives its processed bit decision to a level-shifting data latch 115 that latches the processed bit decision when no redundancy shift is implemented. Should there be a redundancy shift to the remainder of a read path for a redundant column (not illustrated), it would be this other column's level-shifting data latch that would receive the processed bit decision from sense mixing and redundancy shift stage 110. Using a single stage, level-shifting data latch 115 not only latches the processed bit decision but also level shifts the latched bit decision from a memory domain power supply voltage to an output domain such as a core logic domain power supply voltage. In this fashion, the delay and area demand from separate latching and level shifting stages such as in a conventional read path are avoided. A data output driver 120 that drives the latched and level-shifted bit decision from data latch and level shifter 115 completes read path 100.

Figure 2A:
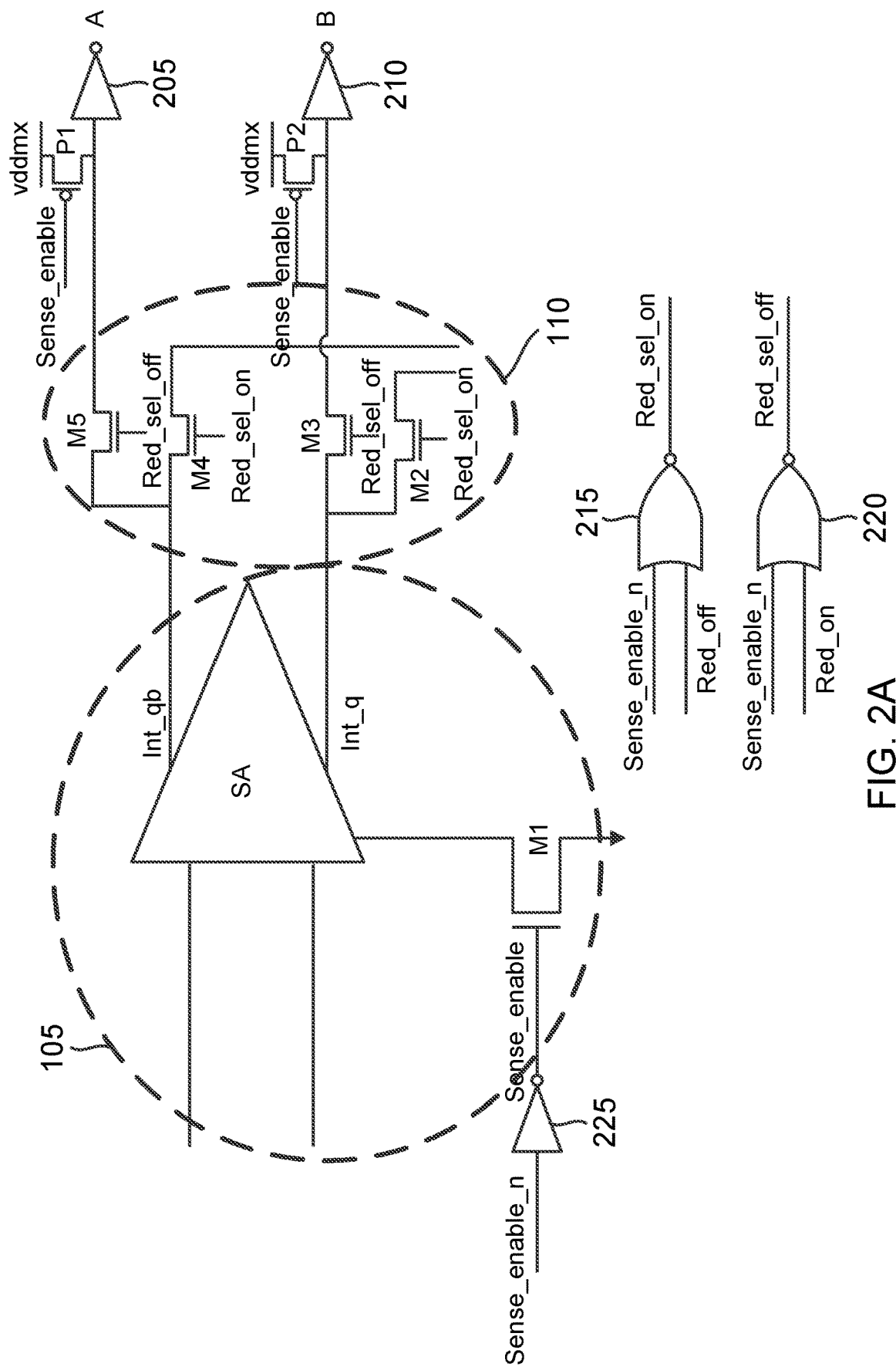
FIG. 2A is a circuit diagram for the sense amplifier and the integrated sense mixing and redundancy shift stage in the memory read path of FIG. 1 in accordance with an aspect of the disclosure.

Sense amplifier 105 and sense mixing and redundancy shift stage 110 are shown in more detail in FIG. 2A. Sense amplifier 105 senses a bit from a pair of bit lines b and b1 and forms a bit decision signal Int_q and its complement signal Int_qb. It will be appreciated that a single-ended sense amplifier may be used in alternative embodiments. Sense amplifier 105 is activated by an NMOS transistor M1 that has a source connected to ground and a drain connected to a ground node for sense amplifier 105. Sense amplifier 105 will thus have power only when transistor M1 conducts in response to an assertion of a sense enable signal (Sense_enable). An inverter 225 inverts a complement sense enable signal (Sense_enable_n) to form the sense enable signal.

Sense amplifier 105 drives the bit decision Int_q through second transistor M3 in sense mixing and redundancy shift stage 110 when the sense enable signal and a redundancy shift off signal (Red_off) are both asserted. In particular, a combined sense enable and redundancy shift-off signal (Red_sel_off) controls a gate of second transistor M3. A logic gate configured to perform NOR logic such as a NOR gate 220 asserts the combined sense enable and redundancy shift-off signal only when both the complement sense enable signal and a redundancy shift-on signal (Red_on) are grounded. The complement sense enable signal is false when the sense enable signal is true. Similarly, the redundancy shift-on signal is false when the redundancy shift-off signal is true. Thus, NOR gate 220 will assert the combined sense enable and redundancy shift-off signal only when both the sense enable signal and the redundancy shift-off signal are true. An inverter 210 inverts the bit decision signal Int_q when second transistor M3 conducts.

If the redundancy shift-on signal is true while the sense enable signal is asserted, second transistor M3 will be shut off but first transistor M2 will conduct. A combined sense enable and redundancy shift-on signal (Red_sel_on) controls the gate of first transistor M2. A logic gate such as a NOR gate 215 asserts the combined sense enable and redundancy shift-on signal when both the complement sense enable signal and the redundancy shift-off signal are false. The complement sense enable signal is of course false when the sense enable signal is true. Similarly, the redundancy shift-off signal is false when the redundancy shift-on signal is true. Thus, NOR gate 215 will assert the combined sense enable and redundancy shift-on signal only when both the sense enable signal and the redundancy shift-on signal are true. With first transistor M2 conducting, sense amplifier 105 drives the bit decision Int_q to the input node of a read path of a redundant column (not illustrated).

Sense mixing and redundancy shift stage 110 accommodates the complement bit decision Int_qb with two analogous transistors. In particular, an NMOS fourth transistor M5 passes the complement bit decision Int_qb when the combined sense enable and redundancy shift-off signal Red_sel_off is asserted. An inverter 205 inverts the complement bit decision Int_qb when fourth transistor M5 conducts. An NMOS third transistor M4 passes the complement bit decision Int_qb to the redundant column when the combined sense enable and redundancy shift-on signal Red_sel_on is asserted.

Inverter 205 drives a node A with the inverted complement bit decision. Similarly, inverter 210 drives a node B with the inverted bit decision. Prior to the sense enable period, both nodes A and B are discharged through the action of a pair of p-type metal-oxide semiconductor (PMOS) transistors P1 and P2. Transistor P1 has its source tied to the power supply node for a memory domain power supply voltage vddmx and has its drain tied to the input of inverter 205. Similarly, transistor P2 has its source tied to the memory power supply node and has its drain connected to the input of inverter 210. The sense enable signal drives the gates of transistors P1 and P2 such that both transistors P1 and P2 will conduct when the sense enable signal is not asserted. Both nodes A and B are thus discharged while the sense enable signal is not asserted.

Figure 2B:
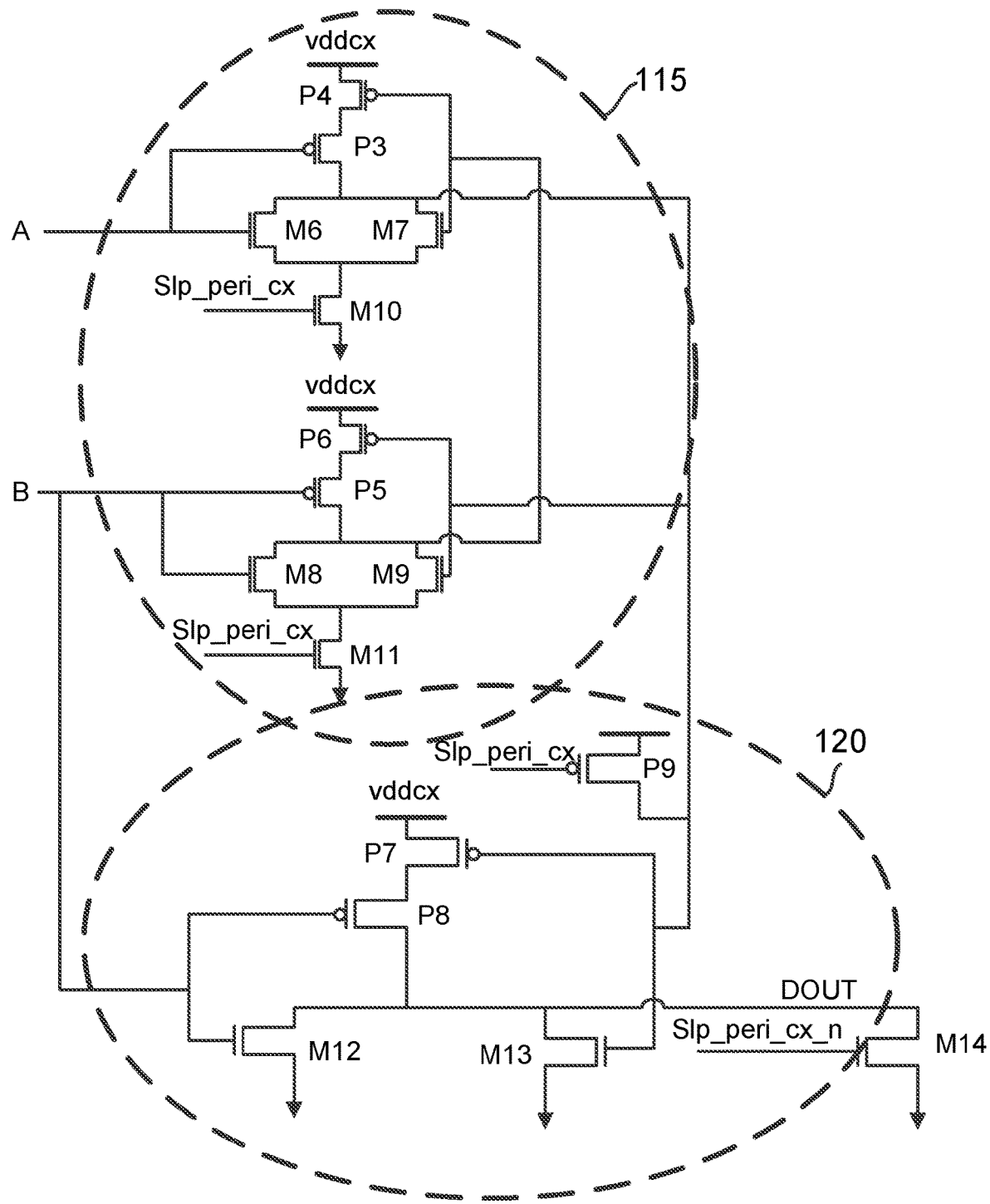
FIG. 2B is a circuit diagram for the integrated data latch and level shifter and also for the data output driver in the memory read path of FIG. 1 in accordance with an aspect of the disclosure.

Nodes A and B form a first input node and a second input node, respectively for level-shifting data latch 115 as shown in FIG. 2B. Node A couples to a gate of an NMOS transistor M6. The source of transistor M6 couples to ground through an NMOS transistor M10 that is controlled by an active low sleep signal for the core logic power domain (Slp_peri_cx). The active low sleep signal will thus be asserted to a core power domain voltage vddcx while the core logic power domain is active (not in sleep mode). Suppose that during a no-redundancy-shift sense enable period that the bit decision Int_q is a logic true signal. The complement bit decision Int_qb will thus be discharged such that node A is asserted to the memory power domain voltage vddmx whereas node B remains discharged. The drain of transistor M6 will then be discharged to ground. The drain of transistor M6 connects to a gate of a PMOS transistor P6 and to a gate of an NMOS transistor M9. The source of transistor M9 couples to ground through an NMOS transistor M11. The active low sleep signal drives the gate of transistor M11 so that transistor M11 is switched on during normal operation. Transistor P6 has its source connected to a power supply node for the core logic domain power supply voltage vddcx. The drain of transistor P6 connects to a source of a PMOS transistor P5 that has its drain connected to the drain of transistor M9. Since the node B connects to a gate for transistor P5, transistor P5 will be on. The drain of transistor P5 will thus be charged to the core logic domain power supply voltage vddcx.

Transistor P6 and M9 are thus coupled in series through the switched-on transistor P5 to form an inverter that inverts the discharged drain voltage of transistor M6 into the charged drain voltage of transistor P6 (and in turn at the drain of transistor P5). The drain of transistor P5 connects to the gate of an NMOS transistor M7 and to a gate of a PMOS transistor P4. Transistor M7 couples to ground through transistor M10. The drain of transistor M7 connects to the drain of transistor M6. The charged drain of transistor P5 thus switches on transistor M7 to enforce the grounding of the drain of transistors M6 and M7. In turn, this grounding of the drain of transistor M7 reinforces the switching on of transistor P6. The inverter formed by transistors P6 and M9 (through the switched-on transistor P5) thus form a latch with transistor M7 to latch the grounding of the drain of transistor M7 and the charging of the drain of transistor M9.

Should the bit decision Int_q be a logic false signal during a no-redundancy-shift sense enable period, node B will be charged to the memory domain power supply voltage vddmx. Conversely node A will be discharged to ground. Transistor P4 has its source connected to the power supply node for the core logic domain power supply voltage vddcx. The drain of transistor P4 connects to a source of a transistor P3 that has its drain connected to the drains of transistors M6 and M7. The node A connects to a gate of transistor P3 so that transistor P3 is switched on in response to the grounding of node A. Transistors P4 and M7 are thus coupled in series through the switched-on transistor P3 to form an inverter. The node B couples to a gate of an NMOS transistor M8. Transistor M8 will thus be switched on in response to the assertion of the node B voltage whereas transistor P5 is switched off. The drain of transistor M8 connects to the drain of transistor P5 whereas the source of transistor M8 couples to ground through transistor M11. Since transistor M8 is switched on, the drain of transistor M8 will thus be discharged to ground. The discharged drain of transistor M8 drives the gate of the inverter formed by transistors P4 and M7 (transistor P3 being switched on). The charged output of this inverter drives the gate of transistor M9. Transistor M9 will thus be switched on to reinforce the grounding of the drain of transistor M8, which in turn reinforces the charging of the drain of transistor P3. The inverter formed by transistors M7 and P4 thus forms a latch with transistor M9 to latch the grounding of the drain of transistor M9 and the charging of the drain of transistor M7.

The drains of transistor P3 and transistor M7 drive a gate of a PMOS transistor P7 and an NMOS transistor M13 in data output driver 120. The source of transistor M13 connects to ground whereas its drain forms an output node DOUT for data output driver 120. Transistor P7 has its source connected to the power supply node for the core logic domain power supply vddcx and its drain connected to a source of a PMOS transistor P8 that has a drain connected to the output node DOUT. An NMOS transistor M12 has its drain connected to the output node and a source tied to ground. The output node B connects to a gate for transistor M12 and to a gate for transistor P8. As discussed herein, should bit decision Int_q be a logic false signal during a no-redundancy-shift sense enable period, node B will be charged to the memory domain power supply voltage vddmx. Transistor M12 will thus be switched on to ground the output node DOUT. Transistor P8 is switched off. As also discussed herein, the low state for the bit decision Int_q causes the drain of transistor M7 to be charged to the core logic domain power supply voltage vddcx. Transistor M13 will thus also be switched on to reinforce the grounding of the output node DOUT whereas transistor P7 is switched off.

If the bit decision Int_q is a logic true signal, node B is discharged to switch off transistor M12 and switch on transistor P8. The drain of transistor M7 is also discharged, which switches off transistor M23 and switches on transistor P7. The output node DOUT will thus be charged to the core logic domain power supply voltage vddcx should the bit decision Int_q be a logic true signal.

A PMOS transistor P9 is switched on during a sleep mode for the core logic domain, which causes transistor M13 to switch on to ground the output node DOUT. The grounding is reinforced through an NMOS transistor M14 that has its gate controlled by a complement (Slp_peri_cx_n) of the core logic domain sleep signal. The output node DOUT is thus grounded during this sleep mode. Similarly, transistors M10 and M11 are also switched off during this sleep mode of operation.

Figure 3:
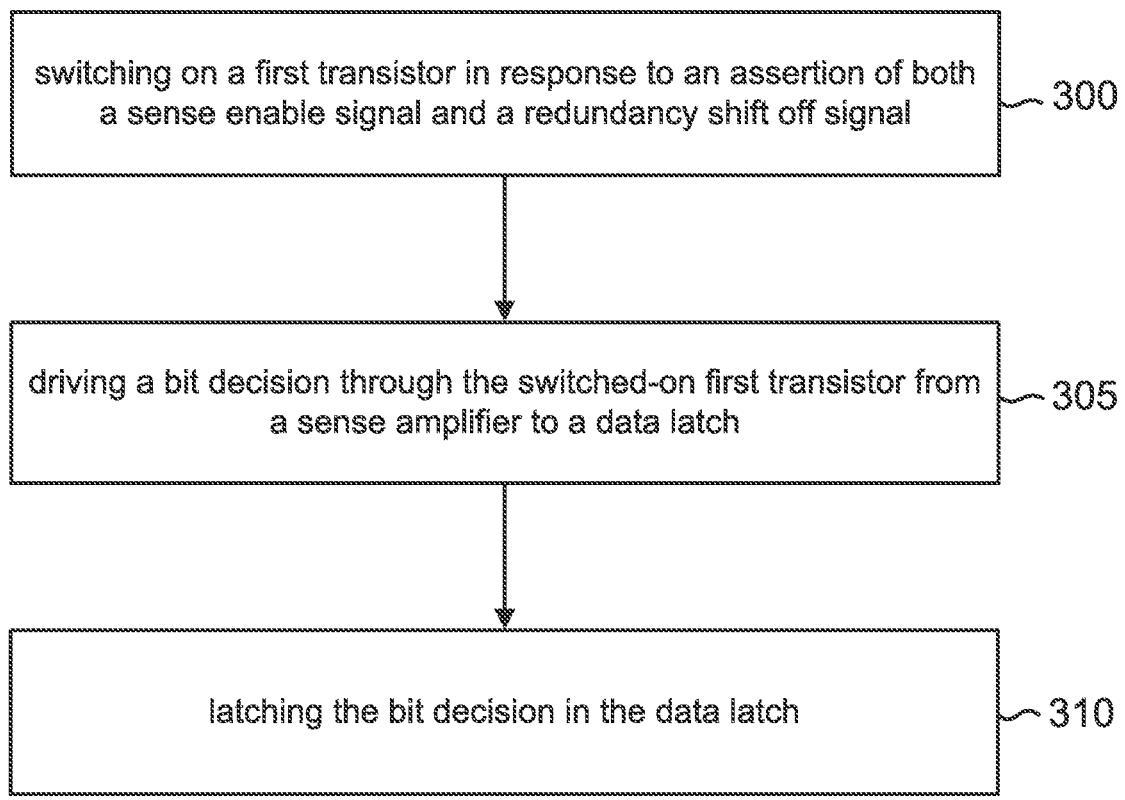
FIG. 3 is a flowchart of a method of operation for a memory read path in accordance with an aspect of the disclosure.

A method of operation for a memory read path will now be discussed with regard to the flowchart of FIG. 3. The method includes an act 300 of switching on a first transistor in response to an assertion of both a sense enable signal and a redundancy shift off signal. The switching on of transistor M3 or transistor M5 is an example of act 300. The method also includes an act 305 of driving a bit decision through the switched-on first transistor from a sense amplifier to a data latch. The conduction of the bit decision Int_q through transistor M3 to level-shifting data latch 115 or the conduction of complement bit decision Int_qb through transistor M5 to level-shifting data latch 115 is an example of act 305. Finally, the method includes an act 310 of latching the bit decision in the data latch. The latching of the bit decision Int_q in level-shifting data latch 115 is an example of act 310.

Figure 4:
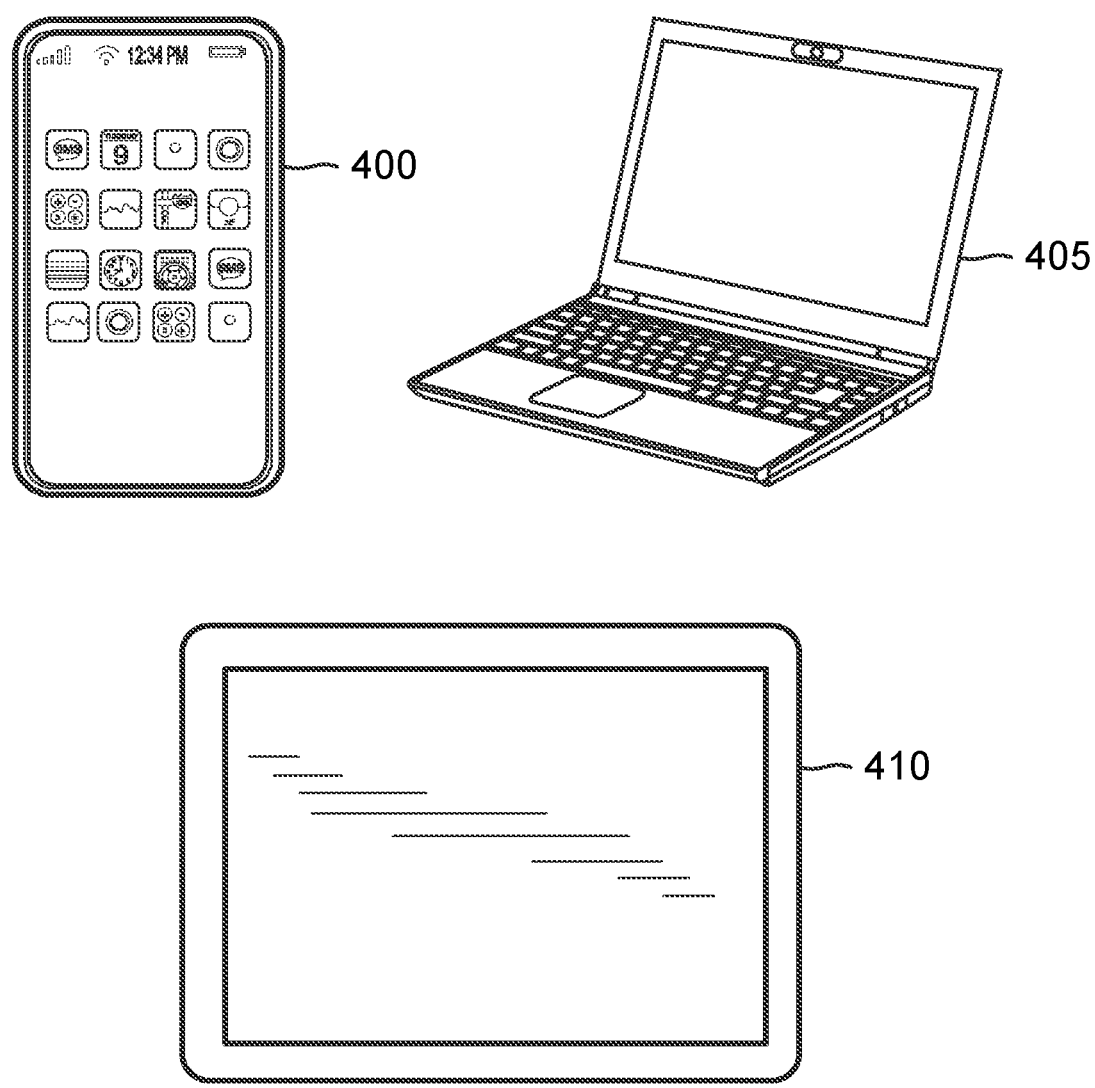
FIG. 4 illustrates some example electronic systems each incorporating a memory having a read path in accordance with an aspect of the disclosure.

A memory with a read path as disclosed herein may be incorporated into a wide variety of electronic systems. For example, as shown in FIG. 4, a cell phone 400, a laptop 405, and a tablet PC 410 may all include a memory having a read path in accordance with the disclosure. Other exemplary electronic systems such as a music player, a video player, a communication device, and a personal computer may also be configured with memories constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A read path for a memory, comprising:
a sense amplifier configured to sense a bit decision signal responsive to a read operation;
a level-shifting data latch configured to latch the bit decision signal to form a latched bit decision signal and to level shift the latched bit decision signal from a memory domain power supply voltage to an external domain power supply voltage; and
a first transistor coupled between an output node of the sense amplifier and an input node to the level-shifting data latch; and
a first logic gate configured to assert a combined sense enable and redundancy shift-off signal in response to an assertion of both a sense enable signal and a redundancy shift-off signal, wherein the first transistor is configured to switch on in response to the assertion of the combined sense enable and redundancy shift-off signal to conduct the bit decision signal from the sense amplifier to the integrated data latch and level shifter.

2. The read path of claim 1, further comprising an output data driver configured to drive the latched bit decision signal from the memory.

3. The read path of claim 1, wherein the first logic gate comprises a NOR gate.

\* \* \* \* \*